(12) United States Patent
Murtojärvi

(10) Patent No.: US 6,668,162 B1
(45) Date of Patent: Dec. 23, 2003

(54) METHOD AND AN ARRANGEMENT FOR COMPENSATING THE TEMPERATURE DRIFT OF A DETECTOR AND A CONTROL SIGNAL IN PERIODIC CONTROL

(75) Inventor: Simo Murtojärvi, Salo (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/496,777

(22) Filed: Feb. 3, 2000

(30) Foreign Application Priority Data

Feb. 3, 1999 (FI) ................................................. 990202

(51) Int. Cl.[7] .............................................. H04B 17/00
(52) U.S. Cl. ................. 455/115.1; 455/126; 455/127.1; 455/127.2; 455/116; 330/289; 330/278; 330/279
(58) Field of Search ................................ 455/115, 126, 455/116, 127; 330/289, 278, 279, 129

(56) References Cited

U.S. PATENT DOCUMENTS

| 5,212,814 | A | * | 5/1993 | Iwane |
| 5,438,683 | A | | 8/1995 | Durtler et al. ................. 455/74 |
| 5,796,309 | A | * | 8/1998 | Nguyen |
| 5,854,971 | A | * | 12/1998 | Nagoya et al. |
| 6,173,160 | B1 | * | 1/2001 | Liimatainen |
| 6,370,364 | B1 | * | 4/2002 | Liimatainen |

FOREIGN PATENT DOCUMENTS

| EP | 0481524 A3 | 4/1992 |
| EP | 0561754 A1 | 9/1993 |
| EP | 0843420 A2 | 5/1998 |

* cited by examiner

*Primary Examiner*—Nguyen T. Vo
*Assistant Examiner*—Huy Nguyen
(74) *Attorney, Agent, or Firm*—Perman & Green, LLP

(57) ABSTRACT

The object of the invention is the compensation of the drift in a detector and a control signal (TXC), particularly in the control of the transmit power ($RF_{OUT}$) of an RF time division TDMA signal ($RF_{IN}$), for the control of which there is performed a power detection. According to the invention the voltage difference between the output voltage of the detection and the control signal is stored during a transmission pause, and during the transmission state the stored voltage difference is used to compensate the temperature drift of the detection and the control signal (TXC) in generating the gain control voltage ($V_{CTRL}$). The voltage difference is stored in a capacitor connected between the detector and a feedback connected differential amplifier by connecting the inputs of the differential amplifier to each other and by connecting the output of the differential amplifier to a constant potential when the control signal (TXC) is connected to an input of the differential amplifier which is not that input to which said capacitor is connected. Also alternative ways to perform the storage are presented.

22 Claims, 12 Drawing Sheets

METHOD AND AN ARRANGEMENT FOR COMPENSATING THE TEMPERATURE DRIFT OF A DETECTOR AND A CONTROL SIGNAL IN PERIODIC CONTROL

BACKGROUND OF THE INVENTION

1. Field of the Invention

The object of the invention is to compensate the temperature drift of a detector and a control signal, in other words to compensate the offset caused by the temperature change, in a periodic control action in order to reduce the variation caused to the controlled phenomenon, particularly in a mobile station such as a mobile phone.

2. Description of Related Art

Such periodic control actions are at least the Automatic Gain Control (AGC) and the transmission power control. Such a controlled phenomenon is generally the power of an RF (radio frequency) signal. At the control moment the control signal sets the desired control result, such as the power of the signal to be amplified. The temperature drift of the detector is at least partly due to a change in the threshold voltage of the diode, and the temperature drift of the control signal is at least partly due to a change in the output voltage of the digital-to-analogue converter. Further errors can be caused by a changed dependence between the inputs of the differential amplifier.

A problem in low-power applications is particularly the temperature drift on one hand of the detector diode in a detector indicating the magnitude of the power, such as a diode detector, and on the other hand of the power control signal. For instance, the temperature drift of a simple diode detector is typically 2 mV/° C. The detector receives a signal with an amplitude, which as a minimum can be only a few millivolts. When the width of the temperature range is for instance 100° C. it causes temperature drift which is many times higher than a signal with a small amplitude. In order to reduce the temperature drift it is known to compensate a diode detector according to FIG. 1A with a second diode. The compensation is made in the block B1 by a circuitry after the capacitor C1 which connects the RF signal. The circuitry includes an ordinary pull-up resistor R1C and a pull-down resistor R2C, a compensating diode D1C connected between the resistors in the forward direction, and a capacitor C1C connected in parallel with the compensating diode D1C and the pull-down resistor R2C, whereby the signal line is connected through the resistor R3C to the operating voltage side of the compensating diode. The temperature changes which act on the compensating diode D1C are the same or almost the same as those which act on the detector diode D1 which connects the positive half-periods of the RF signal supplied by the capacitor C1 to the integrating capacitor C2 and the load resistor R3. The circuitry is designed so that changes in the characteristics of the compensating diode D1 and the detector diode D1 will cancel each other, so that no temperature drift will occur. The voltage $V_{DET}$ supplied to the terminal $RF_{IN}$ which corresponds to the power of the RF signal is obtained at the integrating capacitor C2 and the load resistor R3.

The circuitry according to FIG. 1A reduces the temperature drift, but the currents with different magnitudes passing through the compensating diode D1C and the detector diode D1 will not enable a complete compensation of the temperature drift. Further the realisation of this circuitry requires many components.

There is also a known detector of periodic power according to FIG. 1B which prevents temperature drift and has a power detector B2 based on a diode D1, an amplifier B3, and a sampling circuit B4. The power detector B2 operates as follows: an RF signal is connected to the input $RF_{IN}$ and further to the capacitor C1, from where the transferred signal acts, via the connection point of the resistance bridge R1, R2 between the operating voltage and the ground and through the diode D1, on the capacitor C2 which can be charged with a positive potential and on a corresponding discharging resistor R3, whereby a voltage level corresponding to the power is supplied to the switch S1. The amplifier B3 operates as follows: in the OFF position the switch S1 switches the reference voltage to the capacitor C3 when no RF signal is transmitted or supplied to the periodic power detector; during signal reception the switch S1 is connected to the ON position, whereby the signal is connected via the resistor R4 to the amplifier A1 having a feedback via the resistor R5. The output of the amplifier A1 provides at the point OUT1 a power detection result which is proportional to the difference of the idle state power and the transmitted power, and this detection result is further supplied to the sampling circuit B4. The sampling circuit B4 operates as follows: at the sampling moment the switch S2 directs the output voltage OUT1 of the amplifier A1 to the capacitor C4, and the voltage of the capacitor is repeated by the amplifier A2 to the point OUT2. A power detector of this kind is used to correct the control of the transmit power of the transmitter.

The circuit according to FIG. 1B will effectively reduce the temperature drift.

A problem in known detectors and controllers is the mutually independent temperature drifts of on one hand the output signal of the detectors used to generate the gain control voltage and on the other hand the control signal setting the magnitude of the gain. The circuitries presented above reduce the temperature drift of the power detector. Typically the control signal is generated by a digital-to-analogue converter having a temperature drift corresponding to the residual temperature drift of the compensated diode detector according to FIG. 1A.

SUMMARY OF THE INVENTION

The object of the invention is to present a control based on a detector and a control signal, so that the control compensates the drift of the output signal of the detector and of the control signal caused for example by temperature variations.

The invention relates to a method for reducing the effects of drift of a detector of transmitted power and of a transmission power control signal in a transmitter arranged to transmit in an intermittent fashion, the output signal from the detector and the control signal controlling at least in part the transmission power of the transmitter. According to the invention, the method comprises at least the steps of storing of a voltage difference between the output voltage of the detector and the control signal during a pause in transmission, and using said stored voltage difference for compensating the drift of the detector and the control signal during a transmission period. The invention also relates to a system for compensating drifts in a transmitter arranged to transmit in an intermittent fashion, the transmitter having at least a detector of transmitted power and a control signal line for controlling the transmitted power. According to the invention the system comprises at least means for storing the voltage difference between the output voltage of the detector and the control voltage in the control signal line during a pause in transmission, and means for compensating the drift of the detector and the control signal during a transmission period using a stored voltage difference stored by said means for storing.

According to a further advantageous embodiment of the invention the system further comprises a compensation and control block for the compensation of the temperature drift of the detection and of the control signal. In a still further embodiment of the invention the compensation and control block further comprises the compensation of the temperature drift of the differential amplifier.

According to a further advantageous embodiment of the invention a system for reducing the effect of the temperature drift of a detector and of a control signal and for compensating the effect of the bias voltage variation in a diode detector is provided, which system comprises a diode detector for detecting the transmit power of an RF time division signal. According to the invention the effect of the bias voltage variations of the diode detector is compensated in the transmit power diode detector, and it comprises a detector diode which is connected so that its forward direction is towards the switching means, a bias resistor connected to a bias voltage, whereby the effect of the variations of the bias voltage is being compensated, an integrating capacitor for equalising the voltage proportional to the RF power, and a series resistance for connecting the voltage further via a resistance division, and the arrangement comprises further a compensation and control block to compensate the temperature drift of the detector and of the control signal, which arrangement comprises an impedance from a constant potential to a connection point, a feedback impedance, a differential amplifier, a control signal connection resistance for adding the control and the diode detector's signal to the positive input of the differential amplifier, a compensating capacitor between the connection point and the negative input of the differential amplifier, a compensation switch between the inputs of the differential amplifier for arranging the charge of the compensating capacitor for the compensation by closing the compensating switch with a switch control signal during the pause.

According to a still further aspect of the invention, a mobile communication means is provided. According to this aspect of the invention, the mobile communication means comprises a system for compensating drifts in the transmitter of the mobile communication means, and in said system, means for storing the voltage difference between the output voltage of the detector and the control voltage in the control signal line during a pause in transmission, and in said system, means for compensating the drift of the detector and the control signal during a transmission period using a stored voltage difference stored by said means for storing.

According to the invention the transmission pause in the time division radio system is used to compensate the drifts of the control of the transmit power caused for example by temperature variations. For instance, in the GSM system the length of the transmission burst is about 600 μs, and the lime ratio of the transmission state/pause is ⅛. The compensation is based on a low or almost negligible change of the temperature during the transmission, and thus on a possibility to perform the compensation during a transmission pause. During the transmission pause there is no transmit power, so the output of the detector goes to a dc voltage corresponding to the state without any signal. Then the control signal is also a constant voltage. In this situation there is not allowed any voltage difference between the inputs of the differential amplifier, and the output voltage must be zero or a constant voltage which is lower than the level which causes the operation of the output stage, so that the power control performed at the beginning of the transmission state could be made error-free. The power is increased by increasing the voltage of the control signal to a level corresponding to the desired power.

The temperature drift of the detector and of the control signal has an impact on the power during the transmission pause which should be zero, on the power increase, and on the transmit power during the transmission. However, the transmit power can be prevented during a transmission pause, because the operation of the differential amplifier and/or the power amplifier generally also is switched on or off with the aid of a particular control signal. Then the error caused by the temperature drift will appear as a discontinuity in the power control between the transmission state and the pause, and it will not be possible to perform a controlled power increase or decrease. When the temperature drift is large it causes also a detectable magnitude error in the increased transmit power.

The transmission pause is used for the compensation of the transmit power by switching, during the transmission pause, the inputs of the differential amplifier to each other and by connecting the output to a constant potential, such as the ground, whereby the capacitor connected, in a manner according to the invention between on one hand the connection point of the detector and differential amplifier's feedback circuit and on the other hand the output of the differential amplifier, is charged to a value corresponding to the error caused by the temperature drift of both the detector and the control signal, when the second input of the differential amplifier is connected to the control signal. At the end of the transmission pause the circuitries used for the compensation are released, and the power controller is in balance so that despite the temperature drifts of the detector and the control signal there is no voltage between the inputs of the differential amplifier, and the output of the differential amplifier has no voltage compared to the ground potential. When the transmission state begins the voltage of the control signal is increased and both the gain control voltage and the transmit power will increase in a controlled manner. Due to the high gain of the differential amplifier and the power amplifier and due to the slowness of the power detection and the power amplifier control, the differential amplifier most preferably has a feedback and its output is low-pass filtered in order to maintain a stable control. However, the feedback and the low-pass filter and the required other components are prior art, and they can be designed on the basis of the characteristics of the power amplifier and the differential amplifier.

Advantageous embodiment of the invention are presented in the dependent claims.

BRIEF DESCRIPTION OF THE DRAWINGS

Below the invention is described in derail with reference to the enclosed drawing. where.

Figure 1A:
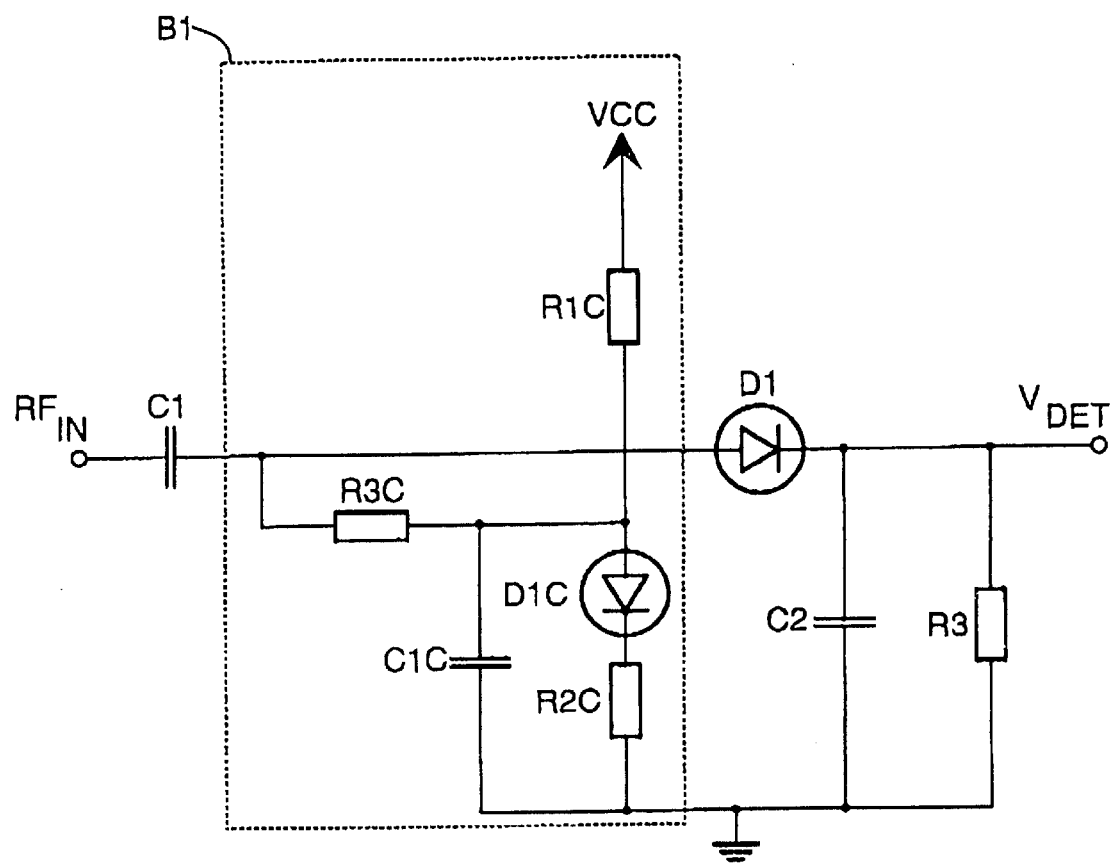
FIG. 1 shows a circuit diagram of a known power detector.
Figure 1B:
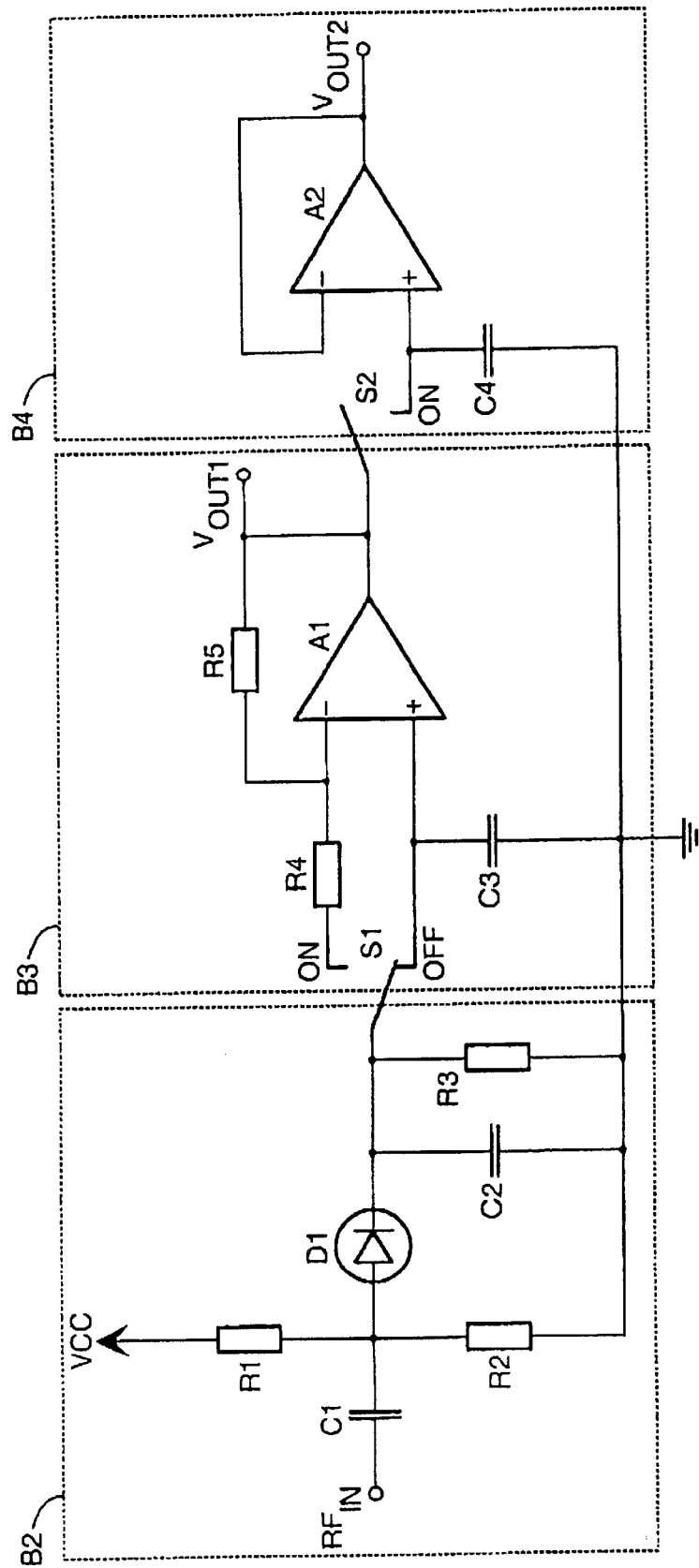

The FIGS. 1A and 1B were described above in the prior art section.

DETAILED DESCRIPTION OF THE PREFERRED EMBODIMENTS

Figure 2A:
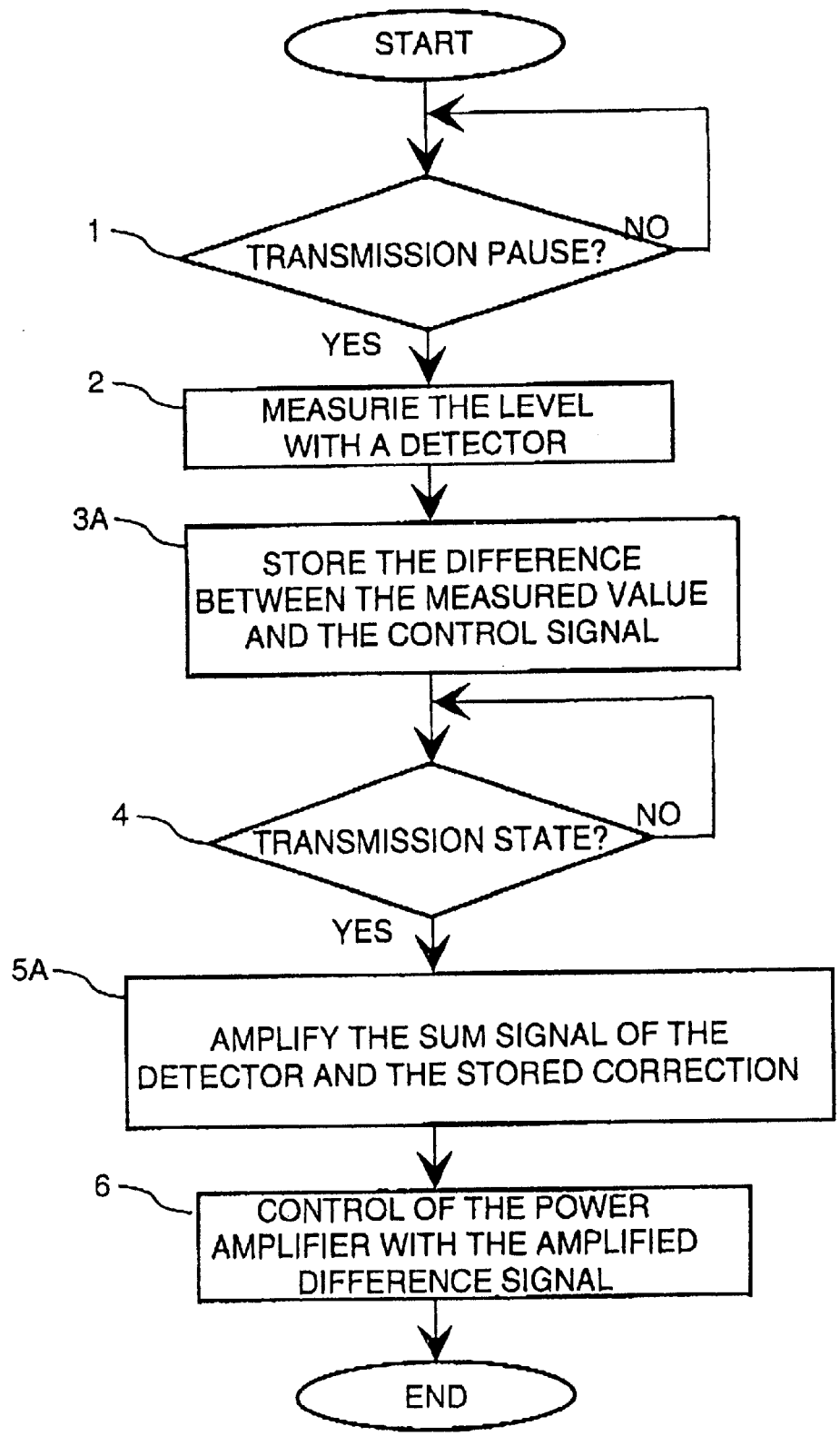
FIG. 2 shows a flow diagram of a method according to an advantageous embodiment of the invention for generating a control voltage.

FIG. 2A shows a flow diagram of a method according to the invention for generating for an amplifier a non-drifting control voltage from the detector output signal and the control signal. First, during the transmission pause 1, the voltage difference between the output voltage of the detection 2 and the control signal is stored 3A. The voltage difference is stored 3A in a capacitor connected between the detector and the differential amplifier by connecting the inputs of the differential amplifier to each other, and if the amplifier has a feedback, by connecting the output of the differential amplifier to a constant potential, when the control signal has been connected to an input of the differential amplifier which is not that input to which said capacitor is connected.

Alternatively the voltage difference is stored 3A in a capacitor connected between the control signal and an input of the differential amplifier by connecting the inputs of the differential amplifier to each other, and if the amplifier has a feedback, by connecting the output of the differential amplifier to a constant potential, when the detector output and any feedback has been connected to an input of the differential amplifier which is not that input to which said capacitor is connected.

During the transmission state 4 the stored voltage difference is used 5A to compensate the temperature drift of the detection and of the control signal in generating the control voltage which controls 6 the power amplifier.

Figure 2B:
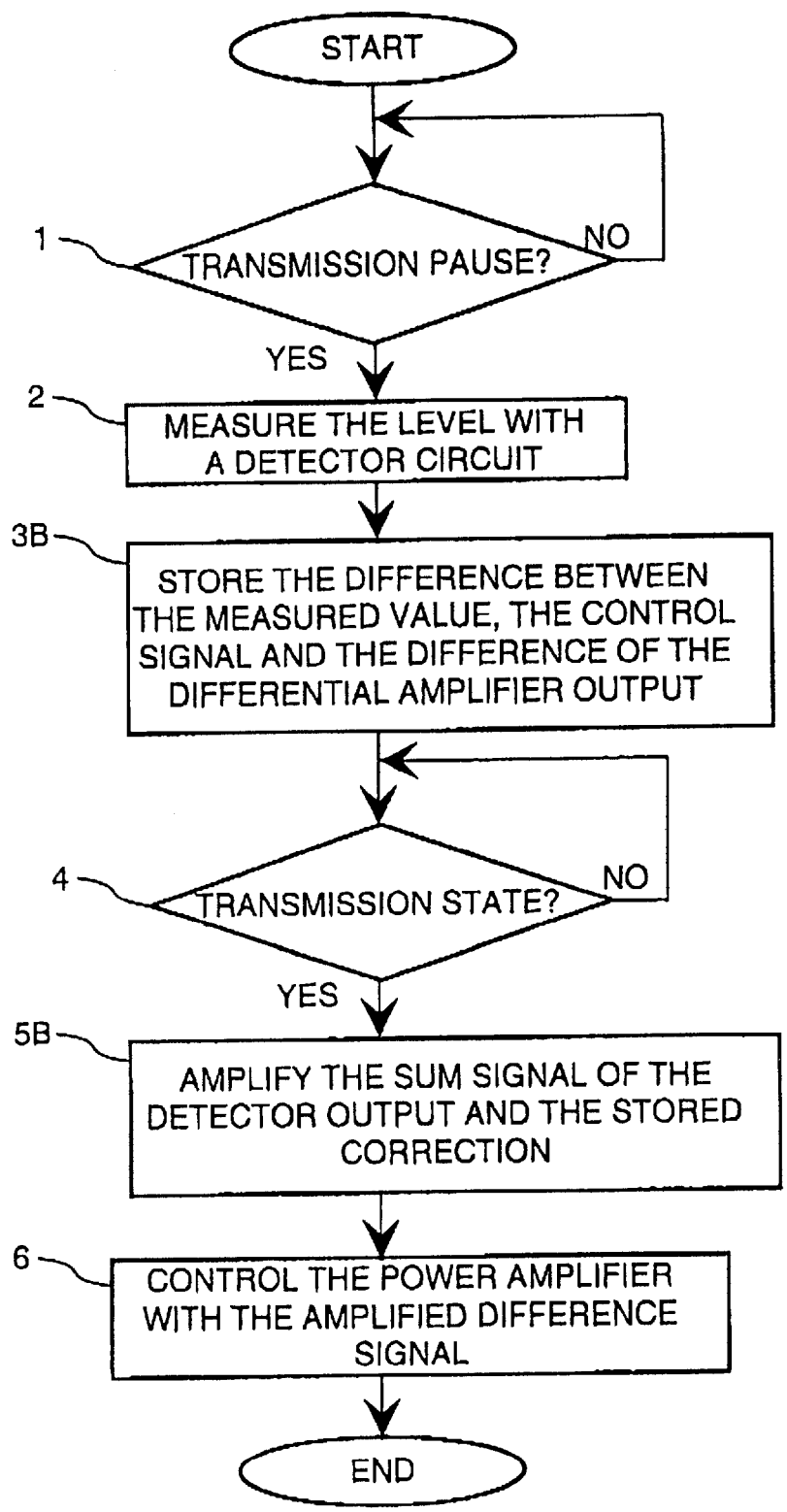

FIG. 2B shows a flow diagram of another method according to the invention for generating for an amplifier a non-drifting control voltage from the detector output signal and of a control signal. First, during the transmission pause 1, the voltage difference between the detection output signal 2 and the control signal is stored 3B, whereby the offset voltage of the differential amplifier is added to the control signal.

The voltage difference is stored 3B in a capacitor connected between the detector and the differential amplifier by connecting the input of the differential amplifier and the capacitor to the output of the differential amplifier, by disconnecting the output of the differential amplifier from the rest of the circuit, and by connecting the connection point disconnected from the output of the differential amplifier to a constant potential, when the control signal has been connected to an input of the differential amplifier which is not that input to which said capacitor is connected. Alternatively, the voltage difference is stored 3B in a capacitor connected between the detector and the differential amplifier by connecting the input of the differential amplifier and the capacitor to the output of the differential amplifier. Then the output of the differential amplifier is a constant potential which corresponds to the value of the control signal from which is subtracted the offset voltage of the differential amplifier. Thus the value of the control signal during the pause state can be used to set the desired initial value for the control voltage of the amplifier. During the transmission state 4 the stored voltage difference, which also is caused by the differential amplifier, is used 5B to compensate the temperature drift of the differential amplifier offset, of the detector and of the control signal when generating the control signal which controls 6 the power amplifier.

The offset voltage means the voltage difference of the inputs, which is caused by non-idealities and which is required for setting the zero potential of the amplifier output.

Figure 3A:
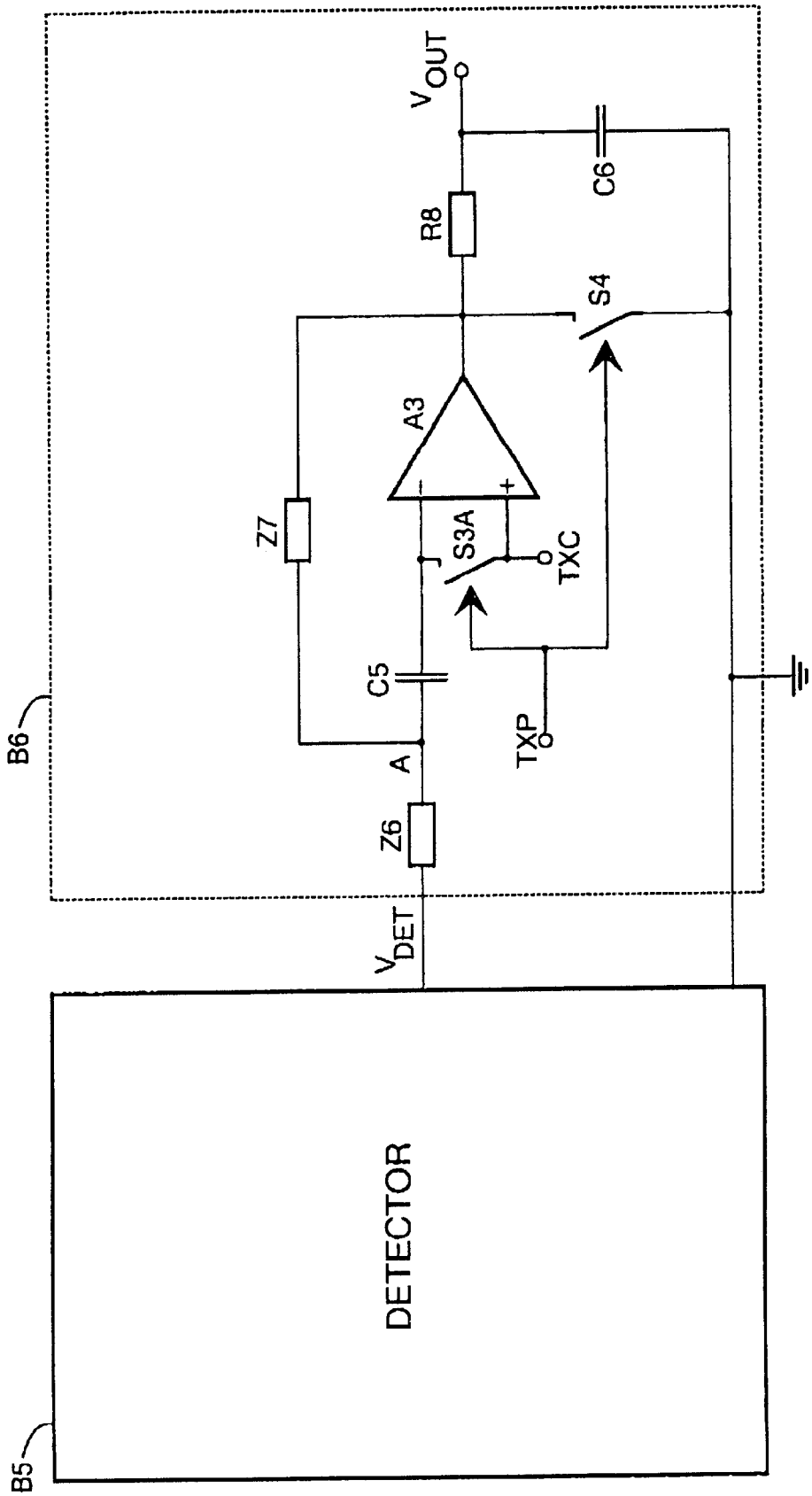
FIG. 3 shows circuit diagrams of circuits according to an advantageous embodiment of the invention which generate the control voltage.

FIG. 3A shows a circuit diagram of a circuit according to the invention which generates the control voltage. The circuit shows a detector B5, from which the voltage corresponding the detected signal is supplied to the compensation and control block B6.

In order to compensate the detector and the control signal TXC there is shown in the compensation and control block B6 a series impedance Z6, a feedback impedance Z7, a connection point A between the series and feedback impedances Z6, Z7, a differential amplifier A3, to whose positive input the control signal TXC is connected, a compensation capacitor C5 between on one hand the connection point of the series impedance Z6 and the feedback impedance Z7 and on the other hand the negative input of the differential amplifier A3, the compensation switches, S3A between the inputs of the differential amplifier, and S4 between the output and the ground, in order to arrange the charge of the compensation capacitor C5 for the compensation by closing them during the transmission pause with the aid of the switch control signal TXP. The power gain is set with the values of the series impedance Z6 and the feedback impedance Z7.

In the compensation and control block B6, B7 there is also seen the RC low-pass filter R8, C6 for the output voltage $V_{OUT}$. The low-pass filter R8, C6 and the impedances Z6, Z7 are optional, and the filter can be realised also with other control engineering circuits. The output of the detector B5 is connected directly to the point A when there is no Z6 and it is not replaced by another circuitry. Instead of being connected to the ground the switch S4 can be connected to a constant potential for the period of the compensation, or it may be omitted if a suitable potential is arranged by any other means to the output of the differential amplifier for the period of the compensation. For instance a differential amplifier can be connected so that when the differential amplifier is in the idle state its output voltage is low, or so that when the output is in a high impedance state a suitable potential to the output is supplied from the connection point of the Output Voltage $V_{OUT}$.

Figure 3B:
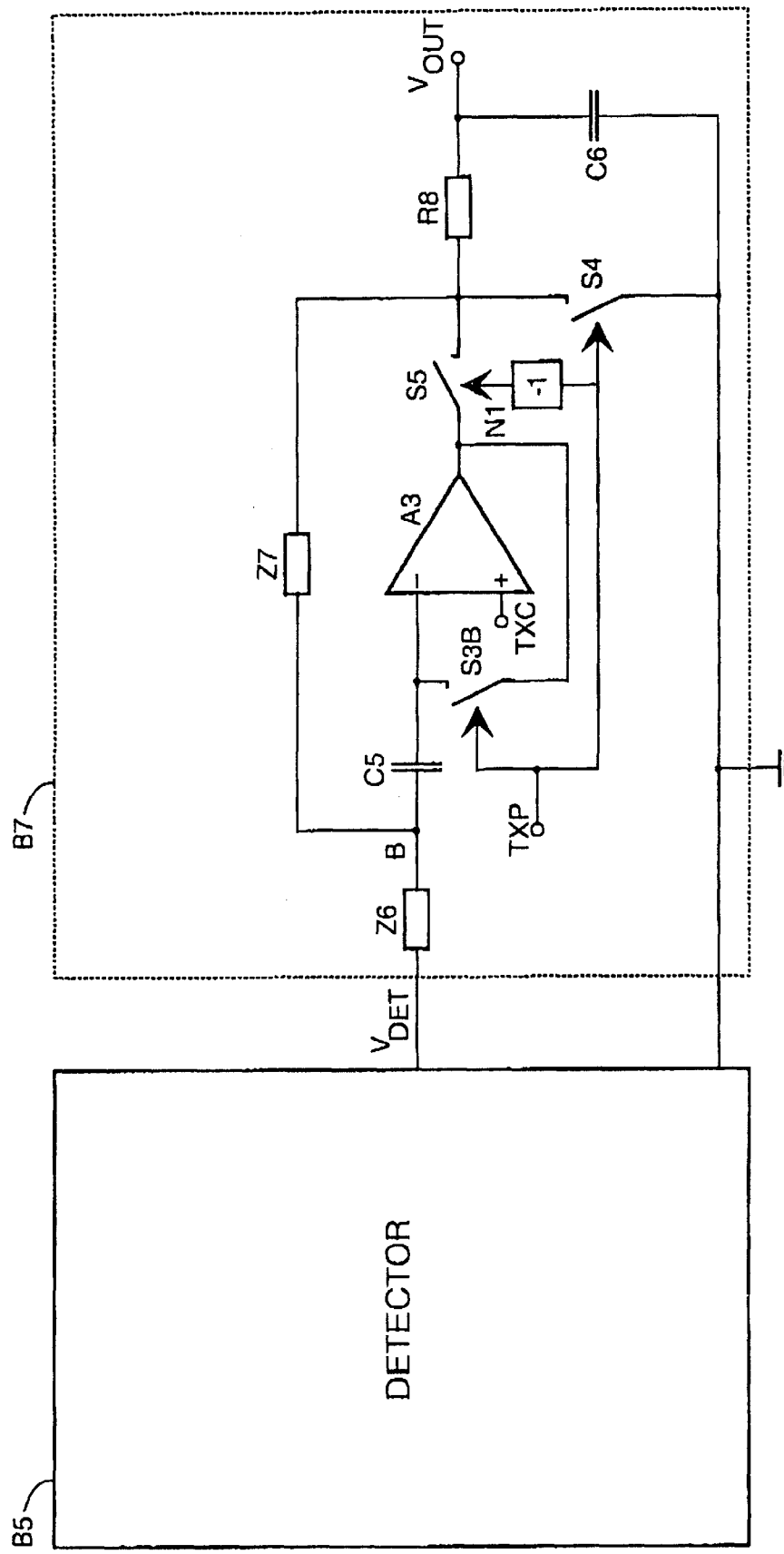

The FIG. 3B shows a circuit diagram of another circuit according to the invention generating the control signal. The circuit shows the detector B5 which supplies a voltage corresponding to the detected signal to the compensation and control block B7.

In the compensation and control block B7 for compensating temperature drift of the detector, the control signal TXC and of the differential amplifier A3 there is shown a series impedance Z6, a feedback impedance Z7, a connection point B between the series and feedback impedances Z6, Z7, a differential amplifier A3, to whose positive input the control signal TXC is connected, a compensation capacitor C5 between on one hand the connection point of the series impedance Z6 and the feedback impedance Z7 and on the other hand the negative input of the differential amplifier A3, a compensation switch S3B between the negative input and the output of the differential amplifier A3, a compensation switch S5 between the output and the feedback impedance Z7, and a compensation switch S4 between the disconnectable feedback impedance Z7 and the ground, in order to arrange the charge of the compensation capacitor C5 for the compensation by closing, opening and closing the respective switch in their presentation order during the transmission pause with the aid of the switch control signal TXP. The gain of the control signal is set with the values of the series impedance Z6 and the feedback impedance Z7.

In the compensation and control block B6, B7 there is also seen the RC low-pass filter R8, C6 for the output voltage $V_{OUT}$. The low-pass filter R8, C6 and the impedances Z6, Z7 are optional, and the filter can be realised also with other control engineering circuits. The output of the detector B5 is connected directly to the point B when there is no Z6 and it is not replaced by another circuitry. Instead of being connected to the ground the switch S4 can be connected to a constant potential for the period of the compensation, or it may be omitted if a suitable potential is arranged by any other means to the output of the differential amplifier for the period of the compensation.

Figure 3C:
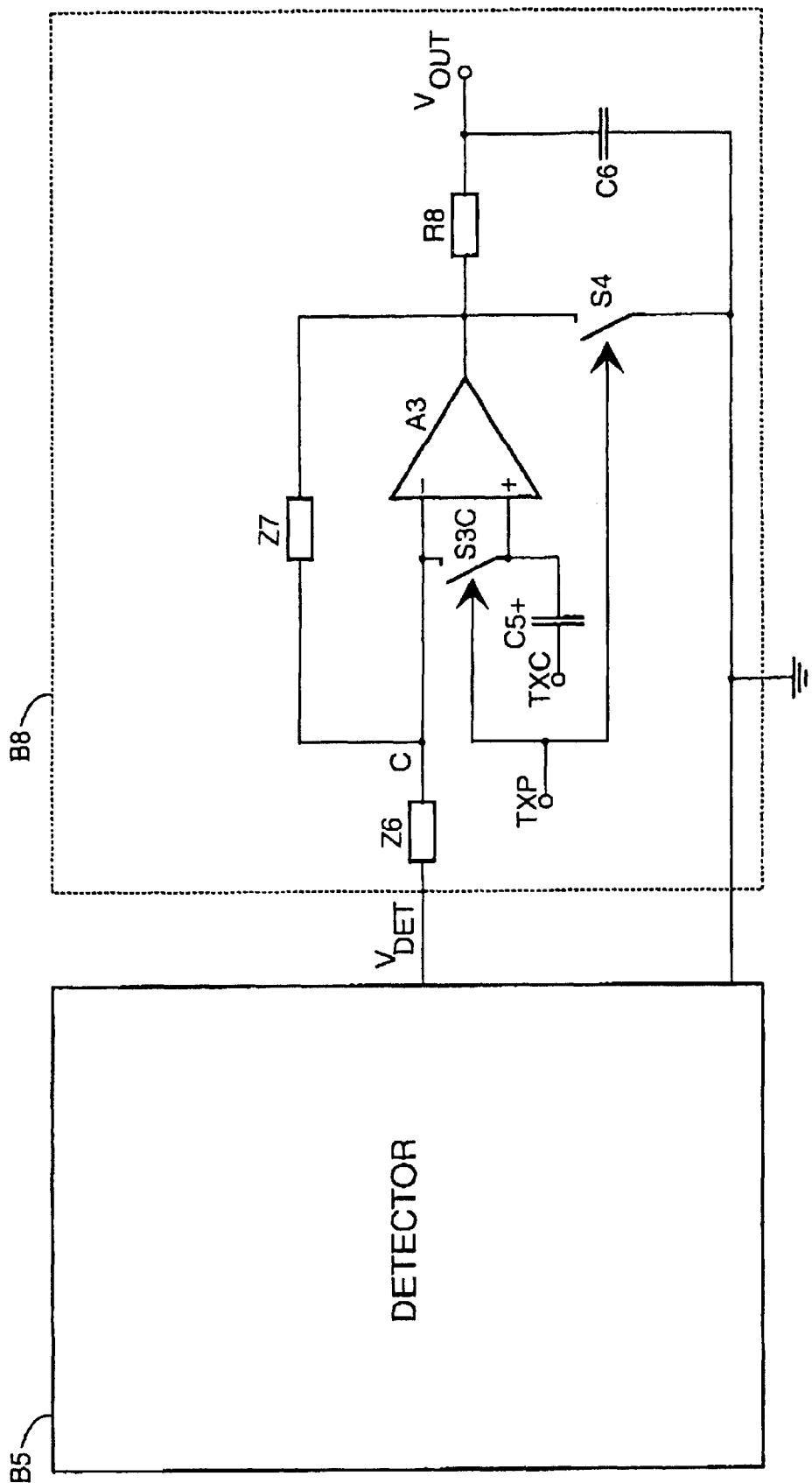

The FIG. 3C shows a circuit diagram for an alternative to the solution of FIG. 3A for how to locate the compensation capacitor CS between the positive input of the differential amplifier A3 and the control signal TXC in the compensation and control block B8. Here the connection point is C. In other respects the solution of FIG. 3C corresponds to the solution of FIG. 3A.

Figure 3D:
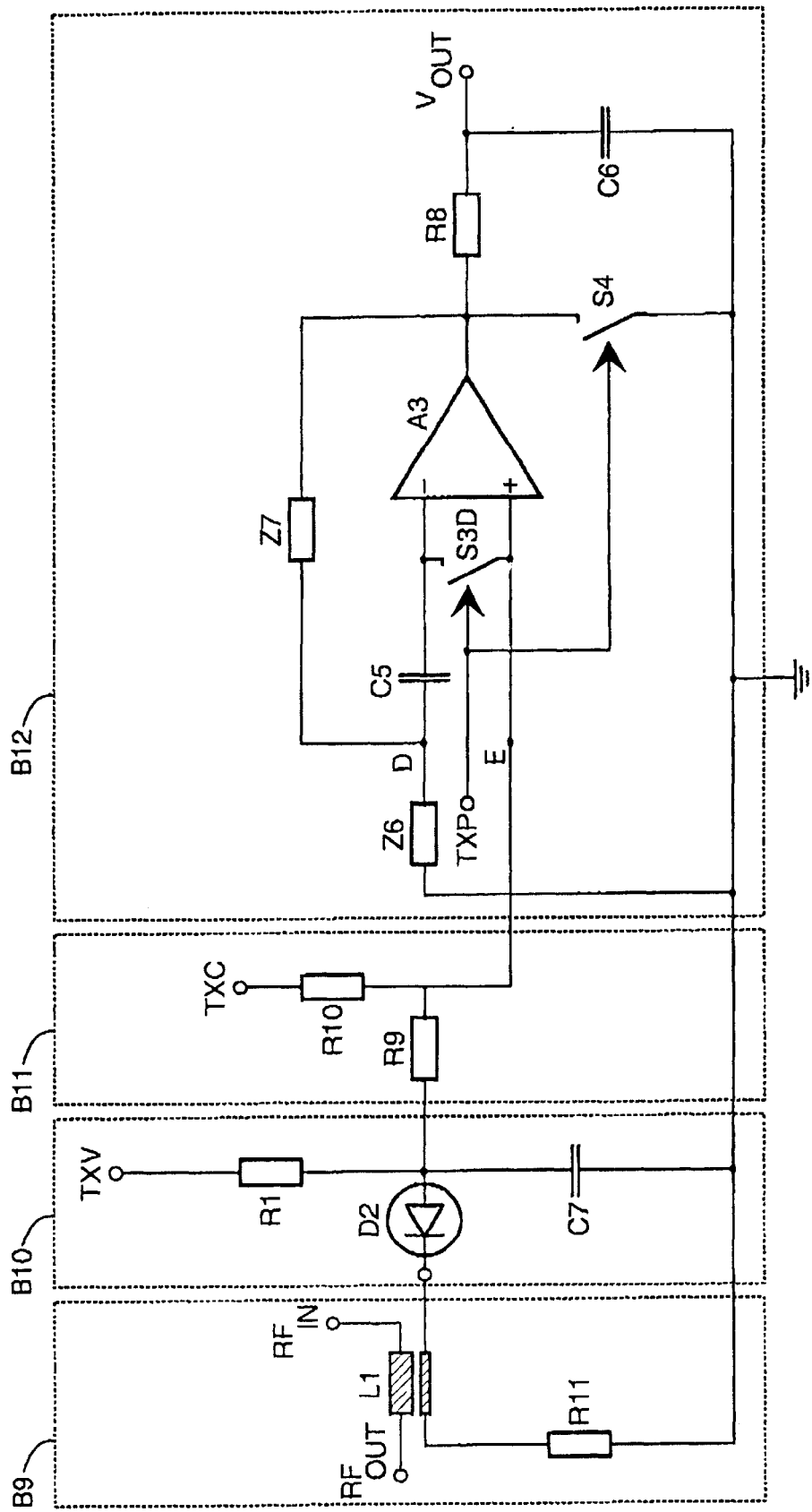

FIG. 3D shows a circuit diagram of a solution according to the invention where it is taken into account, at the beginning of the transmission state, any voltage decrease of the signal TXV generating the bias voltage of the diode D2. When this voltage decrease is not corrected it causes an error in the output power control. In the diode detector B10 the current of the resistor R1 generating the bias voltage passes through the diode D2 to the coupling means L1 of the coupling block B9 and through the terminal resistor R11 to the ground. An efficient voltage division is obtained because the resistance R1 generating the bias voltage can be dimensioned to be large compared to the value of the terminal resistor R11, whereby a change of TXV is coupled so that it is attenuated by the ratio of the resistances R1 and R11. The capacitor C7 equalises the diode detection voltage which is transferred via the series resistor R9 to the connection point E, to which there is also connected the power control signal TXC via the resistor R10, and which is further connected to the positive input of the differential amplifier A3. The differential amplifier A3 has a feedback impedance Z7 to the connection point D, but in this case the impedance Z6 is connected to the ground. The impedance Z6 could as well be connected to a constant potential. The switches S3D, S4, the compensation capacitor C5 and the lowpass filter R8, C6 are connected as in the solution according to FIG. 3A above. The low-pass filter R8, C6 and the impedances Z6, Z7 are optional, and the filter can be realised also with other control engineering circuits. The point D is connected to a constant potential when there are no impedances Z6 and Z7. The output voltage of the detector from the connection point between the capacitor C7 and the diode D2 as well as the power control signal TXC are connected for summing with the aid of the resistors R9 and R10 in the summing block B11. However, the summing can be realised also with other means known to a person skilled in the art.

Instead of being connected to the ground the switch S4 in the block B12 can be connected to a constant potential, or it may be omitted if a suitable potential is arranged to the output of the differential amplifier for the period of the compensation. For instance the differential amplifier can connected so that when the differential amplifier is the idle state the output voltage is low, or so that when the output is in a high impedance state a suitable potential to the output is supplied from the connection point of the output voltage $V_{OUT}$. Also in this embodiment the compensation capacitor C5 can be alternatively located between the point E and the common point of the positive input of the differential amplifier A3 and the switch S3D, whereby the negative input of the differential amplifier A3 is connected directly to the point D.

Figure 3E:
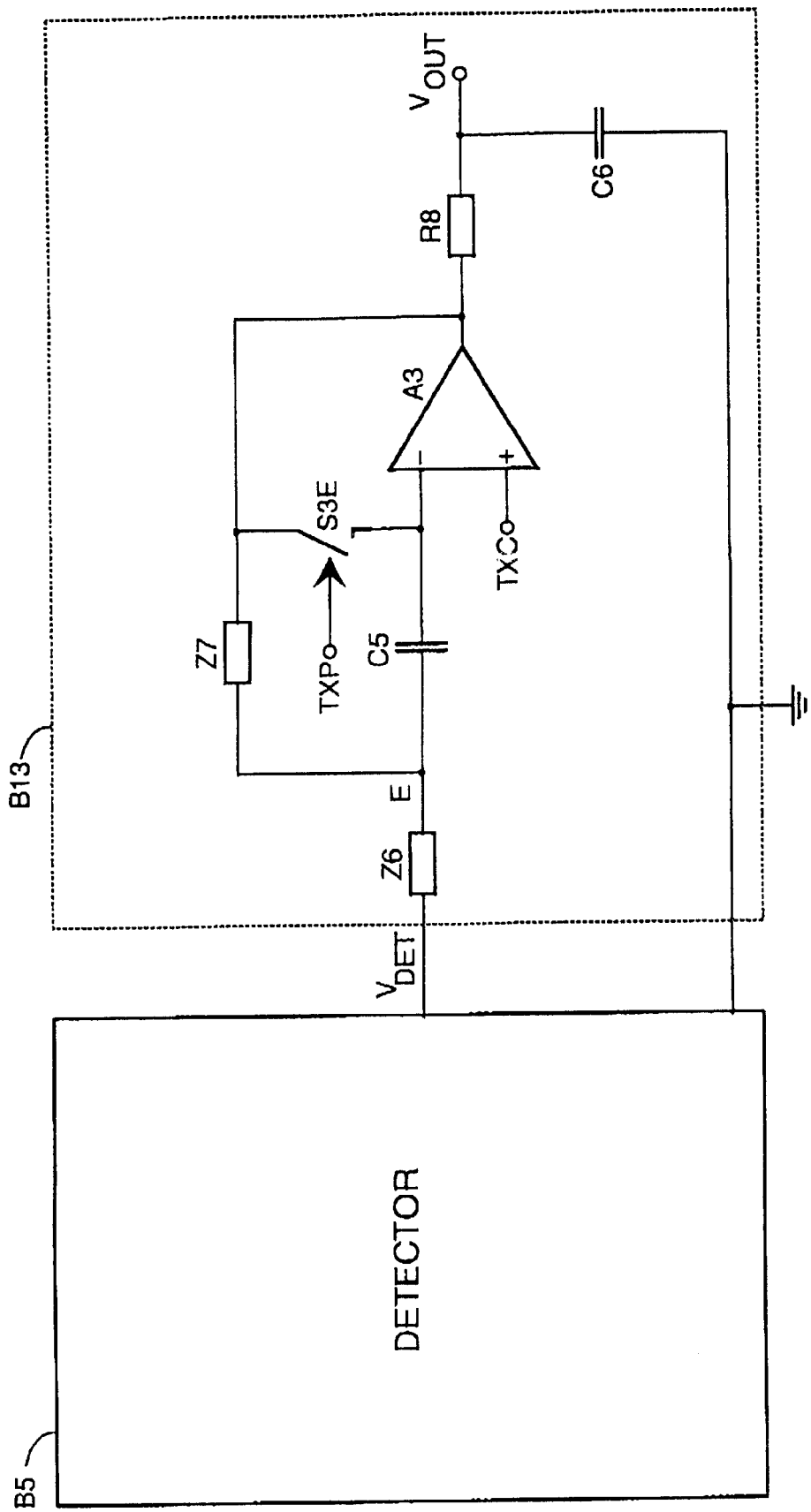

FIG. 3E shows still another solution according to the invention for generating the control voltage. The voltage from the detector B5 is connected via the series impedance Z6 to the point E. From point E the voltage is connected via the capacitor C5 to the negative input of the differential amplifier A3, to which there is also connected the switch S3E from the output of the differential amplifier. The power control signal TXC is connected to the positive input of the differential amplifier A3. The circuitry utilises the characteristic mutual relation between the power control and the control signal, which is typical to many output amplifiers, where the output power follows the control only when the control signal is higher than a certain dc voltage. Thus there is a so called dead zone when the power control voltage is lower, and in this zone neither the control voltage nor the control signal resulting from it will affect the output power.

During a transmission pause the output $V_{OUT}$ provides a voltage corresponding to the value of the power control signal TXC, because the power control signal TXC is set to a low voltage value and the switch S3E is closed. At the same time the capacitor C5 is charged to the voltage difference between the point E and the output of the differential amplifier A3. The dead zone of the power control can be reduced by setting, during the transmission pause, the power control signal TXC close to the starting limit of the operation of the output stage. The effect of the drift of the detector's operating point is compensated by using before each transmission period the voltage difference between the differential amplifier's A3 output voltage and the point A to control the power during the transmission, whereby this voltage difference was charged in the capacitor C5. The low-pass filter R8, C6 and the impedances Z6, Z7 are optional, and the filter can be realised also with other control engineering circuits.

The resistor R8, the capacitor C6 and the impedances Z6 and Z7 are typical components of a power control circuit which are determined by taking into account the characteristics of the output amplifier, the differential amplifier, the detector, and the desired control type. Control types are for instance the proportional (P), the derivative (D) and the integrating (I) control. It is also possible to combine control types.

The switch S4 shown in the FIGS. 3A, 3C and 3D is not necessary, and the use of it requires that the output current of the differential amplifier is restricted.

Figure 4A:
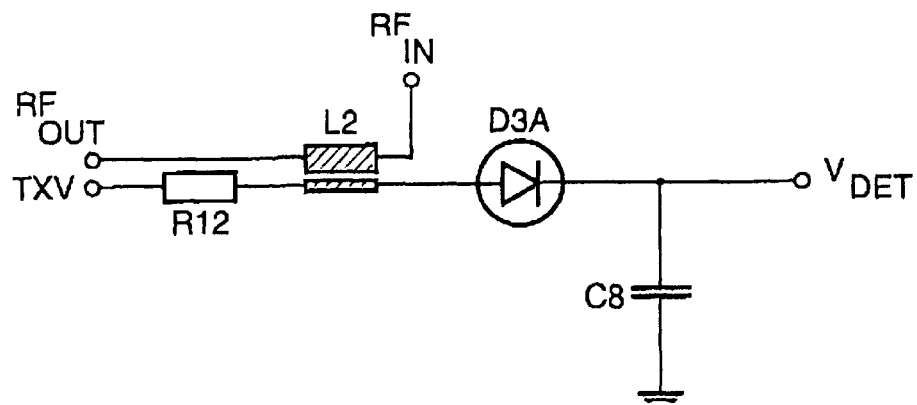
FIG. 4 shows a circuit diagrams of detectors which are used according to an advantageous embodiment of the invention.

FIG. 4A presents a simple power detector where a part of the power of the RF signal $RF_{IN}$ is taken with the aid a coupling means L2, such as a directional coupler, to the diode D3A which is biased via the resistor R12 by the operating voltage TXV of the detector, so that the positive half-periods of the signal will charge the capacitor C8. In the capacitor C8 there is formed a voltage, which is proportional to the maximum power of the signal $RF_{IN}$ and which is connected to the output $V_{DET}$. The detector is connected to a compensation and control block, whereby a dc path for the diode D3 is obtained with help of the feedback impedances Z6 and Z7.

Figure 4B:
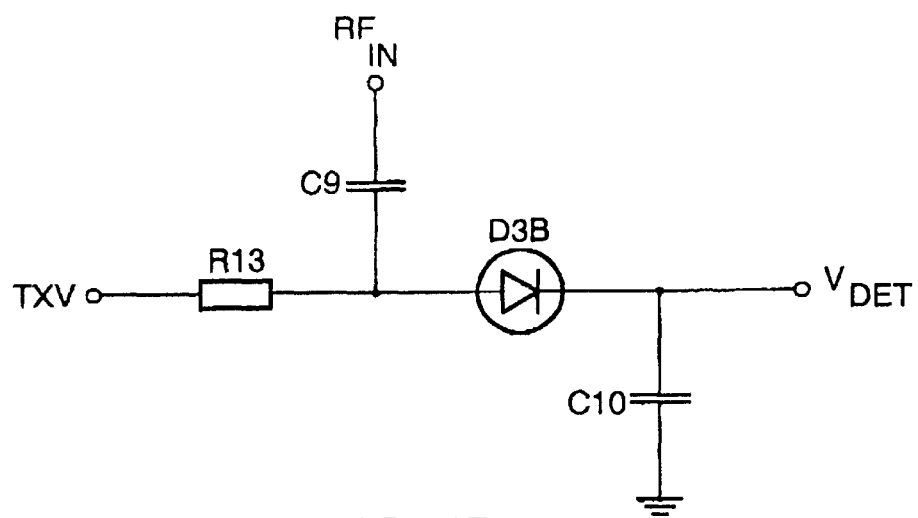

FIG. 4B shows another simple power detector where the RF signal $RF_{IN}$ is connected with the capacitor C9 to the diode D3B, and a dc path is formed by the resistor R13 from the detector's operating voltage TXV and by the feedback impedances Z6 and Z7. The RF power is connected with the diode D4 to the capacitor C10.

Figure 4C:
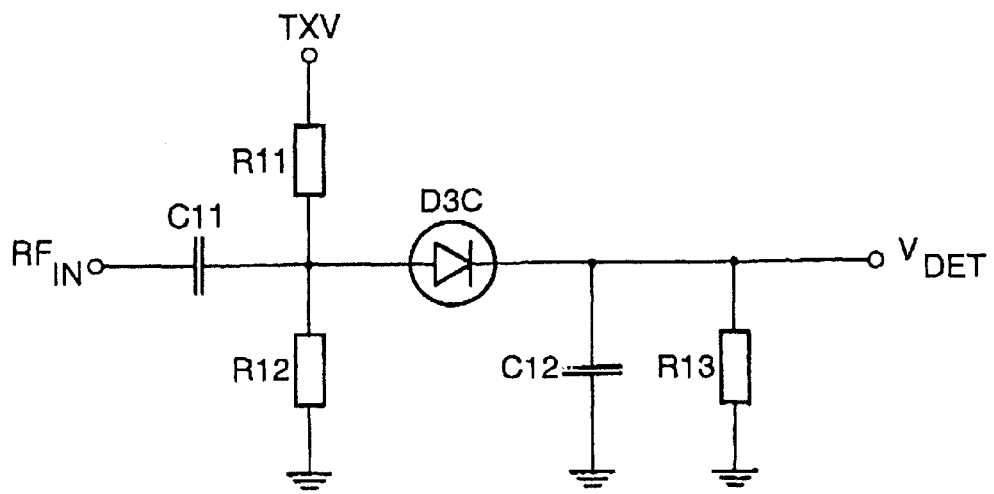

FIG. 4C shows a third power detector where the RF signal is connected from the input $RF_{IN}$ to the capacitor C11, and where the bias voltage of the diode D3C is reduced with the aid of voltage division in the resistors R11 and R12 from the operating voltage TXV. In addition to the chargeable capacitor C12 here is also a discharging resistor R13, due to which the detector can be used also when the voltage $V_{OUT}$ of the power amplification is higher than the output voltage of the diode D5, as the feedback Z6, Z7 supplies current in the backward direction.

Instead of the diode detectors presented above it is possible to use other solutions as the power control detector according to the invention, such as an integrated RSSI circuit which provides a dc output voltage being proportional to the input signal.

The above mentioned constant potential can be replaced by a potential containing the temperature drift compensation of the power amplifier characteristics, whereby the control is corrected also regarding the temperature drift of the power amplifier. This can be realised for instance by supplying from the power amplifier, for instance with a resistor, a voltage proportional to the temperature of the power amplifier to the point $V_{OUT}$ in the compensation and control block.

The above presented series impedance Z6 can have the value zero or a shortcut, and the feedback impedance Z7 can have an infinite value or it can be omitted. Then the amplifier does not have an operational feedback.

Figure 5:
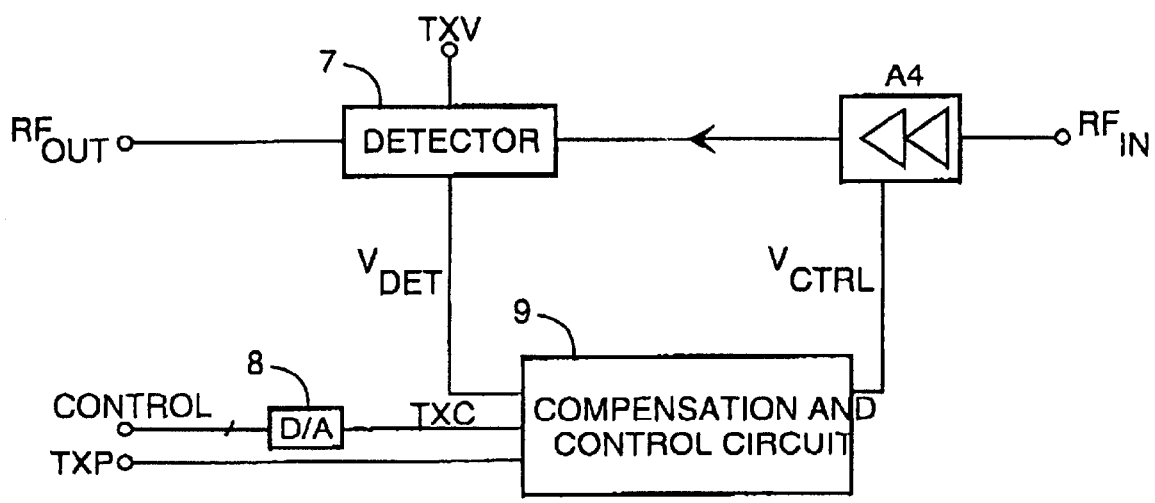
FIG. 5 shows a block diagram of an arrangement according to an advantageous embodiment of the invention for controlling the output power by generating a control voltage.

FIG. 5 shows a block diagram of some essential components regarding the invention in an arrangement according to the invention for controlling the output power. The RF to be amplified is supplied to the point $RF_{IN}$ and further to the power amplifier A4. The amplified signal is output via the detector block 7 to the point $RF_{OUT}$. The detector block 7 receives the operating voltage TXV of the detector and generates the detection voltage $V_{DET}$. The power control signal is transformed from a digital control signal CONTROL in the digital to analogue converter 8 into the form of an analogue voltage TXC. The compensation and control circuit 9 receives the detection voltage $V_{DET}$, the power control signal TXC, the power switching signal TXP, and the circuitry provides the gain control voltage $V_{CTRL}$ for the power amplifier A4.

In the figures those components with a substantially corresponding function have been marked with the same reference numerals.

Let us examine as an example the function of a solution according to the invention functions when the transmission pause changes into the transmission state. At the end of the transmission pause the voltage TXV switches on the power detector, the signal TXP controls the switches S3A, S4, and the power control signal TXC is activated with a low constant control value. The compensation capacitor C5 is charged to the voltage difference between the control signal TXC and the connection point A between the impedances Z6, Z7. A short time before the transmission state is initiated the switches S3A, S4 are opened by the signal TXP. The switch S3A shorting the inputs of the differential amplifier A3 is opened, most preferably a short time before the switch S4 connecting the output of the differential amplifier A4 to the ground, so that no voltage peaks are generated in the output voltage $V_{OUT}$ of the controller.

When the normal power control is switched on in the manner presented above the power control signal is increased in a manner according to the desired output power. Then the output voltage of the differential amplifier A3 rises until the voltage of the connection point A has increased as much as the control signal TXC voltage was increased. The compensation capacitor C5 retains its charge during the transmission state, and thus it operates as a constant voltage source which corrects the errors in the initial values of the detector's output signal and of the power control signal TXC.

Thus the level changes of the detector signal and the power control signal TXC caused by temperature drift are compensated during the transmission pause, and the transmit power control is affected only by the signal level change compared to the transmission pause. However, it is not possible to compensate the temperature drift of the interval length of the digital to analogue converter generating the power control signal TXC.

Figure 6:
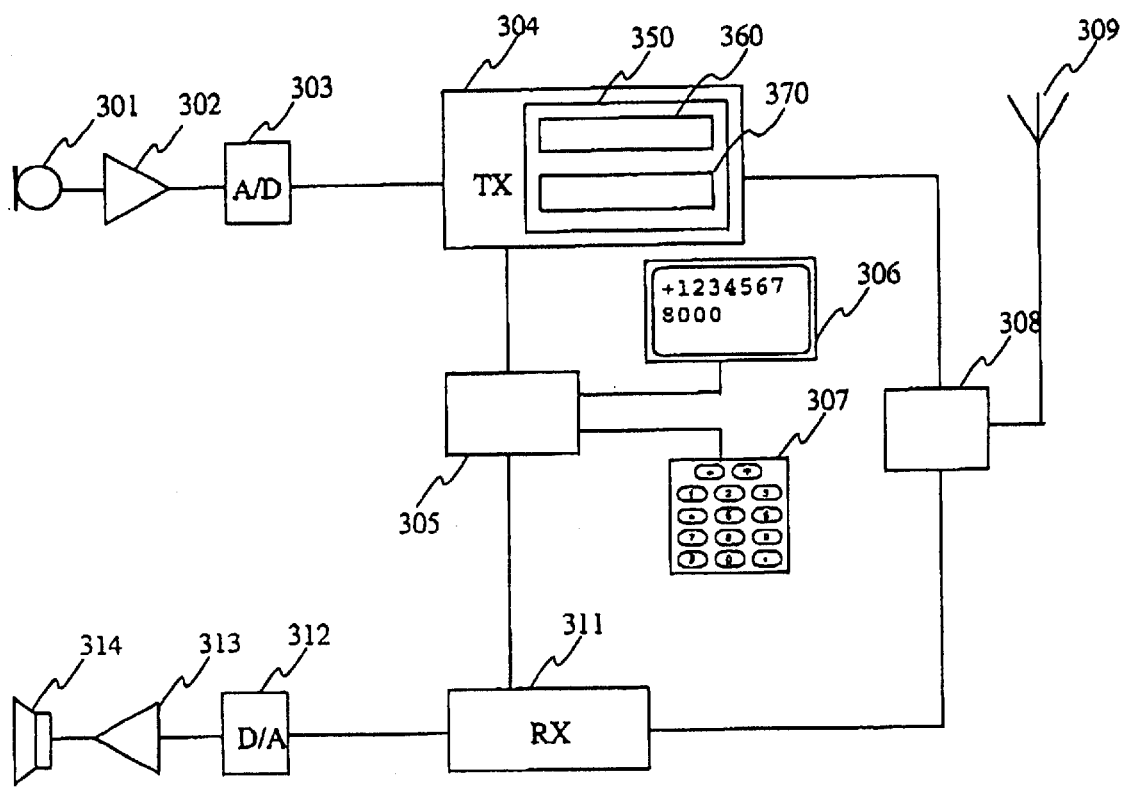
FIG. 6 shows a block diagram of a mobile communication means according to an advantageous embodiment of the invention.

FIG. 6 shows a block diagram of a digital mobile communication means according to an advantageous embodiment of the invention. The mobile communication means comprises a microphone 301, keyboard 307, display 306, earpiece 314, antenna duplexer or switch 308, antenna 309 and a control unit 305, which all are typical components of conventional mobile communication means. Further, the mobile communication meals contains typical transmission and receiver blocks 304, 311. Transmission block 304 comprises functionality necessary for speech and channel coding, encryption, and modulation, and the necessary RF circuitry for amplification of the signal for transmission. Receiver block 311 comprises the necessary amplifier circuits and functionality necessary for demodulating and decryption of the signal, and removing channel and speech coding. The signal produced by the microphone 301 is amplified in the amplifier stage 302 and converted to digital form in the A/D converter 303, whereafter the the signal is taken to the transmitter block 304. The transmitter block encodes the digital signal and produces the modulated and amplified RF-signal, whereafter the RF signal is taken to the antenna 309 via the duplexer or switch 308. The receiver block 311 demodulates the received signal and removes the encryption and channel coding. The resulting speech signal is converted to analog form in the D1A converter 312, the output signal of which is amplified in the amplifier stage 313, whereafter the amplified signal is taken to the earpiece 314. The control unit 305 controls the functions of the mobile communication means, reads the commands given by the user via the keypad 307 and displays messages to the user via the display 307. The present invention is not limited to the embodiment of FIG. 6, which is presented as an example only. According to the invention, the mobile communication means further comprises a system 350 for compensating drifts in the transmitter of the mobile communication means, and in said system, means 360 for storing the voltage difference between the Output voltage of the detector and the control voltage in the control signal line during a pause in transmission, and in said system, means 370 for compensating the drift of the detector and the control signal during a transmission period using a stored voltage difference stored by said means for storing.

Time Division Multiple Access (TDMA) systems relating to the subject matter of the invention are for instance the GSM system the PCN system, and the DCS1900 system. The invention is also applicable to other control systems, whereby the controlled quantity can be for instance the automatic grain control or another controlled function.

What is claimed is:

1. A method for reducing the effects of drift of a detector of transmitted power and of a transmission power control signal in a transmitter arranged to transmit in an intermittent fashion, the output signal from the detector and the control signal controlling at least in part the transmission power of the transmitter, comprising at least steps of storing of a voltage difference between the output voltage of the detector and the control signal during a pause in transmission, and using said stored voltage difference for compensating the drift of the detector and the control signal during a transmission period.

2. A method according to claim 1, wherein during a transmission pause the voltage difference, between the output voltage of the detector and the control signal is stored, and during the operating state the stored voltage difference is used for compensating the temperature drift of the detector and of the control signal when the control signal for ha control means for generating the output signal is generated.

3. A method according to claim 1, wherein said voltage difference is stored in a capacitor connected between the detector and the differential amplifier by connecting the inputs of the differential amplifier to each other and by connecting the output of the differential amplifier to a constant potential when the control signal is connected to an input of the differential amplifier which is different to that input to which said capacitor is connected.

4. A method according to claim 3, wherein the effect of the variation of the bias voltage of the detector is compensated by connecting the feedback of the differential amplifier to a constant potential and by supplying the sum of the detection's output voltage and the control signal to a second input of the differential amplifier.

5. A method according to claim 1, wherein said voltage difference is stored in a capacitor connected between the control signal line and the differential amplifier by short-circuiting the inputs of the differential amplifier to each other and by connecting the output of the differential amplifier to a constant potential when the output of the detector is connected to an input of the differential amplifier which is different to that input to which said capacitor is connected.

6. A method according to claim 1, wherein the voltage difference caused by the drift of the differential amplifier is stored during a transmission pause, and that the stored voltage difference is used for compensating the temperature drift of the differential amplifier when the control signal is generated.

7. A method according to claim 6, wherein said voltage difference is stored in a capacitor connected between the detector and the differential amplifier by connecting the input of the differential amplifier and the capacitor to the output of the differential amplifier, when the power control signal is connected to an input of the differential amplifier which is different to that input to which said capacitor is connected.

8. System for compensating drifts in a transmitter arranged to transmit in an intermittent fashion, the transmitter having at least a detector of transmitted power and a control signal line for controlling the transmitted power, comprising at least means for storing the voltage difference between the output voltage of the detector and the control voltage in the control signal line during a pause in transmission, and means for compensating the drift of the detector and the control signal during a transmission period using a stored voltage difference stored by said means for storing.

9. A system according to claim 8, further comprising a compensation and control block for compensating the temperature drift of the detector and of the control signal.

10. A system according to claim 8, further comprising a series impedance for connecting the voltage of the detector to a connection point in the compensation and control block, a feedback impedance, a differential amplifier, whereby the control signal is connected to t he positive input of the differential amplifier, a compensation capacitor between on one hand the connection point between the series impedance and the feedback impedance and on the other hand the negative input of the differential amplifier, a compensation switch between the inputs of the differential amplifier for arranging the charge of the compensation capacitor for the compensation by closing the compensation switch with a switch control signal during a pause.

11. A system according to claim 10 further comprising a compensation switch connected between the output of the differential amplifier and a constant potential for arranging the charge of the compensation capacitor for the compensation by closing also this compensation switch with the switch control signal during a pause.

12. A system according to claim 8 further comprising a differential amplifier, said control line being connected to a first input of the differential amplifier and the output of the detector being functionally connected to a second input of the differential amplifier, and means for compensation of the temperature drift of the differential amplifier.

13. A system according to claim 12 further comprising a series impedance for connecting the voltage of the detector to a connection point, a feedback impedance, a differential amplifier, whereby the control signal is connected to the positive input of the differential amplifier, a compensation capacitor between the connection point of the series impedance and the feedback impedance and the negative input of the differential amplifier, a compensation switch between the negative input and the output of the differential amplifier for arranging the charge of the compensation capacitor for the compensation by closing the compensation switch with a switch control signal during a transmission pause.

14. A system according to claim 12, further comprising a series impedance for connecting the voltage of the detector to a connection point, a feedback impedance, a differential amplifier, whereby the control signal is connected to the positive input of the differential amplifier, a compensation capacitor between the connection point of the series impedance and the feedback impedance and the negative input of the differential amplifier, a compensation switch between the negative input and the output of the differential amplifier, and a compensation switch between the output of the differential amplifier and the feedback impedance, for arranging the charge of the compensation capacitor for the compensation by closing and opening the compensation switches substantially simultaneously relating to the order of presentation with a switch control signal during a transmission pause.

15. A system according to claim 14 further comprising a compensation switch from the disconnectable feedback impedance to a constant potential for arranging the charge of the compensation capacitor for the compensation by closing the compensation switch with a switch control signal during a transmission pause.

16. A system according to claim 12, further comprising
   a series impedance for connecting the voltage of the detector (B5) to a connection point,
   a feedback impedance,
   a differential amplifier, whereby the connection point between the series impedance and the feedback impedance is connected to the negative input of the differential amplifier,
   a compensation capacitor connected between power control signal and the positive input of the differential amplifier,
   a compensation switch between the inputs of the differential amplifier, for arranging the charge of the compensation capacitor for the compensation by closing the compensation switch with a switch control signal during a pause.

17. A system according to claim 16, further comprising a compensation switch between the output of the differential amplifier and a constant potential for arranging the charge of the compensation capacitor for compensation by closing the compensation switch by a switch control signal during a transmission pause.

18. A system according to claim 8, wherein the detector of the time division signal is a diode detector for detecting the transmit power of a time division RF signal, and that the effect of the variation of the bias voltage of the diode detector is compensated, and further comprising
   a detection diode which is forward connected towards a coupling means,
   a bias voltage resistance which is connected to a bias voltage, whereby the effect of the variation of the bias voltage is being compensated,
   an integrating capacitor for equalising the voltage proportional to the RF power, and
   a series resistance for connecting forward the voltage via a resistance division, and that the arrangement further comprises a compensation and control block for the compensation of the temperature drift of the detector and of the control signal, which block comprises
   an impedance from a constant potential to a connection point,
   a feedback impedance,
   a differential amplifier,
   a connection resistance for the control signal for combining the control with the diode detector signal to the positive input of the differential amplifier,
   a compensation capacitor between the connection point and the negative input of the differential amplifier,
   a compensation switch between the inputs of the differential amplifier for arranging the charge of the compensation capacitor for the compensation by closing the compensation switch with a switch control signal during a pause.

19. A system according to claim 18, further comprising a compensation switch connected between the output of the differential amplifier and the ground for arranging the charge of the compensation capacitor for compensation by closing the compensation switch with a switch control signal during a pause.

20. A system according to claim 8 wherein the value of the series impedance is 0Ω.

21. A system according to claim 8, wherein the real and complex values of the feedback impedance are substantially ∞Ω.

22. A mobile communication means comprising
   a system for compensating drifts in the transmitter of the mobile communication means, and
   in said system, means for storing the voltage difference between the output voltage of the detector and the control voltage in the control signal line during a pause in transmission, and
   in said system, means for compensating the drift of the detector and the control signal during a transmission period using a stored voltage difference stored by said means for storing.

* * * * *